(12) United States Patent
Lau et al.

(10) Patent No.: US 6,249,473 B1
(45) Date of Patent: Jun. 19, 2001

(54) POWER DOWN SYSTEM FOR REGULATED INTERNAL VOLTAGE SUPPLY IN DRAM

(75) Inventors: Hon-Shing Lau, Hsinchu; Jeng-Feng Lan, Ping Tung; Jr-Houng Lu, Keelung, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/510,436

(22) Filed: Feb. 21, 2000

(51) Int. Cl.$^7$ ........................................... G11C 7/00
(52) U.S. Cl. ..................... 365/227; 365/222; 365/233; 365/226
(58) Field of Search ................... 365/227, 222, 365/233, 226, 191, 194, 230.03

(56) References Cited

U.S. PATENT DOCUMENTS 6,058,063 * 5/2000 Jang ........................................ 365/227

* cited by examiner

Primary Examiner—David Nelms
Assistant Examiner—David Lam

(57) ABSTRACT

A power down system for regulated internal power supply in DRAM comprises a RAS control module, self-refresh clock control circuit, and a power down control circuit. The RAS control module responds with row address strobe signals to output a first power down control signal. While all the row address strobe signals, which denote states of the memory banks, are in a first condition of inactivity, the first power down control signal will inform the power down system to turn off a regulator in the DRAM under the first condition. The self-refresh clock control circuit responds with a self-refresh clock to output a second power down control signal. While the self-refresh clock is in a second condition of non-self-refresh mode, the second power down control signal will inform the power down system to turn off the regulator under the second condition. The power down control circuit coupling with the ras control module and self-refresh clock control circuit receives an input clock enable signal, the first power down control signal, and the third power down control signal to output a power down signal to turn off the regulator.

14 Claims, 9 Drawing Sheets

POWER DOWN SYSTEM FOR REGULATED INTERNAL VOLTAGE SUPPLY IN DRAM

FIELD OF THE INVENTION

This invention relates to a circuitry for a Dynamic Random Access Memory (DRAM), and more particularly to a power down system for regulated internal voltage supply in DRAM.

BACKGROUND OF THE INVENTION

Dynamic Random Access Memory (DRAM) employs capacitors of its memory cells to reserve charges by external power supply. As a result of the improvement of Very Large Scale Integrated circuits (VLSI) technology, the memory density is moving toward a higher capacity, thus multiplying the number of memory cells. Those multiplied memory cells consume a great amount of power supply, but the power specification of the printed circuit board, on which the DRAM is mounted, has remained the same or has even been reduced over the past decades. Therefore, while the number of memory cells and memory density have greatly increased, the internal power consumption has become a vital issue for DRAMs.

For overcoming the disadvantage of high power consumption of the DRAM, a traditional power down scheme is employed to turn off a regulator to cut off internal power supply of the DRAM for saving, on power consumption. When the DRAM enters the power down state, a power down signal responsive to a clock enable signal, which would suspend an internal clock of DRAM, turns off the regulator, thereby stopping the internal power supply for the peripheral circuits and memory banks of the DRAM.

In designing the power down scheme, it is important to carefully consider the relation between the clock enabling signal and ACT command, which is employed to turn on the gates along a selected word line. Since the ACT command takes a period to completely turn on the gates of selected word line, when the clock enable signal follows the ACT command immediately, it would suspend the internal clock, thereby risking the information read or written by the ACT command under incompletion.

In addition, the control of self-refresh clock is also an important concern whiling designing the power down scheme. The self-refresh clock is a normally stable signal. When the self-refresh clock enters the self-refresh mode, it would toggle at a specific frequency to inform the control circuit of the DRAM to refresh its memory cells. Meanwhile, the internal power supply is not available to be cut off due to the proceeding refresh mode. Since the power down scheme could only be activated under a non-refresh mode, correctly detecting the self-refresh clock's waveform for making sure the refresh state turns out to be a key issue for designing power schemes.

As illustrated above, only if the ACT command is completed and the non-refresh mode is detected, the power down scheme would turn off the regulator to decrease the power consumption of the DRAM. Under this understanding, this power down system is proposed to meet the above criteria to save power consumption of the DRAM.

SUMMARY OF THE INVENTION

An object of the invention is to provide a power down system, which comprises a plurality of logic devices, for regulating power supply in a DRAM. The power down system generates a power down signal according to a scheme, which turns off a regulator in the DRAM, only if an ACT command is completed and a waveform of a self-refresh clock is correctly detected.

This invention discloses a power down system for regulated internal power supply in the DRAM, which comprises a RAS control module, self-refresh clock control circuit, and a power down control circuit. The RAS control module responds with row address strobe signals of corresponding memory banks to output a first power down control signal. The row address strobe signals denote whether the memory banks are at active states. While all the row address strobe signals are in a first condition of inactivity, the first power down control signal will inform the power down system to turn off a regulator in the DRAM under the first condition. The self-refresh clock control circuit responds with a self-refresh clock to output a second power down control signal. While the self-refresh clock is in a second condition of non-self-refresh mode, the second power down control signal will inform the power down system to turn off the regulator under the second condition. The power down control circuit coupling with the ras control module and self-refresh clock control circuit receives an input clock enable signal, the first power down control signal, and the third power down control signal to output a power down signal to turn off the regulator for saving power consumption. Since the power down system can only be triggered under the above two conditions, the affection of ACT command and confusion of refresh mode would be avoided.

DETAILED DESCRIPTION OF THE PREFERRED EMBODIMENT

The present power down system employs a scheme, which turns off a regulator in a DRAM only under a non-self-refresh mode and completion of an ACT command. When the power down system detects that the DRAM is at a non-self-refresh mode and confirms that the ACT command has been completed, it would accompany a clock enabling signal to an suspend internal clock to turn off the regulator, thereby saving power consumption. A power down scheme of the invention and an embodiment of the power down system according to the scheme are illustrated as follows.

Before illustrating the scheme and embodiment, several terms are defined as follows.

A "power reset signal (PUNOT)" is a signal for informing the control circuit of DRAM to reset the information reserved in memory cells. The power reset signal is at a low level after the internal power ready.

A "self-refresh clock (SCLK)" is a signal for informing the control circuit to refresh the charges reserved in memory cells. When a memory bank enters the self-refresh mode, the self-refresh clock will toggle at a refresh frequency.

A "row address strobe signal (RAS)" is a signal for turning on gates of a selected word line. While the row address strobe remains at a high level, it denotes that the corresponding memory bank is at an active state. If the row address strobe remains at a low level, it denotes that the corresponding memory bank is at an inactive state.

A "clock enable signal (CKE)" is a signal for suspending an internal clock of DRAM. When the clock enable signal remains at a high level, the internal clock proceeds as normal. If the clock enable signal remains at a low level, the internal clock is accordingly suspended.

When a "power down signal (PD)" remains at a high level, the regulator will be turned off for saving the power consumption.

Figure 1:
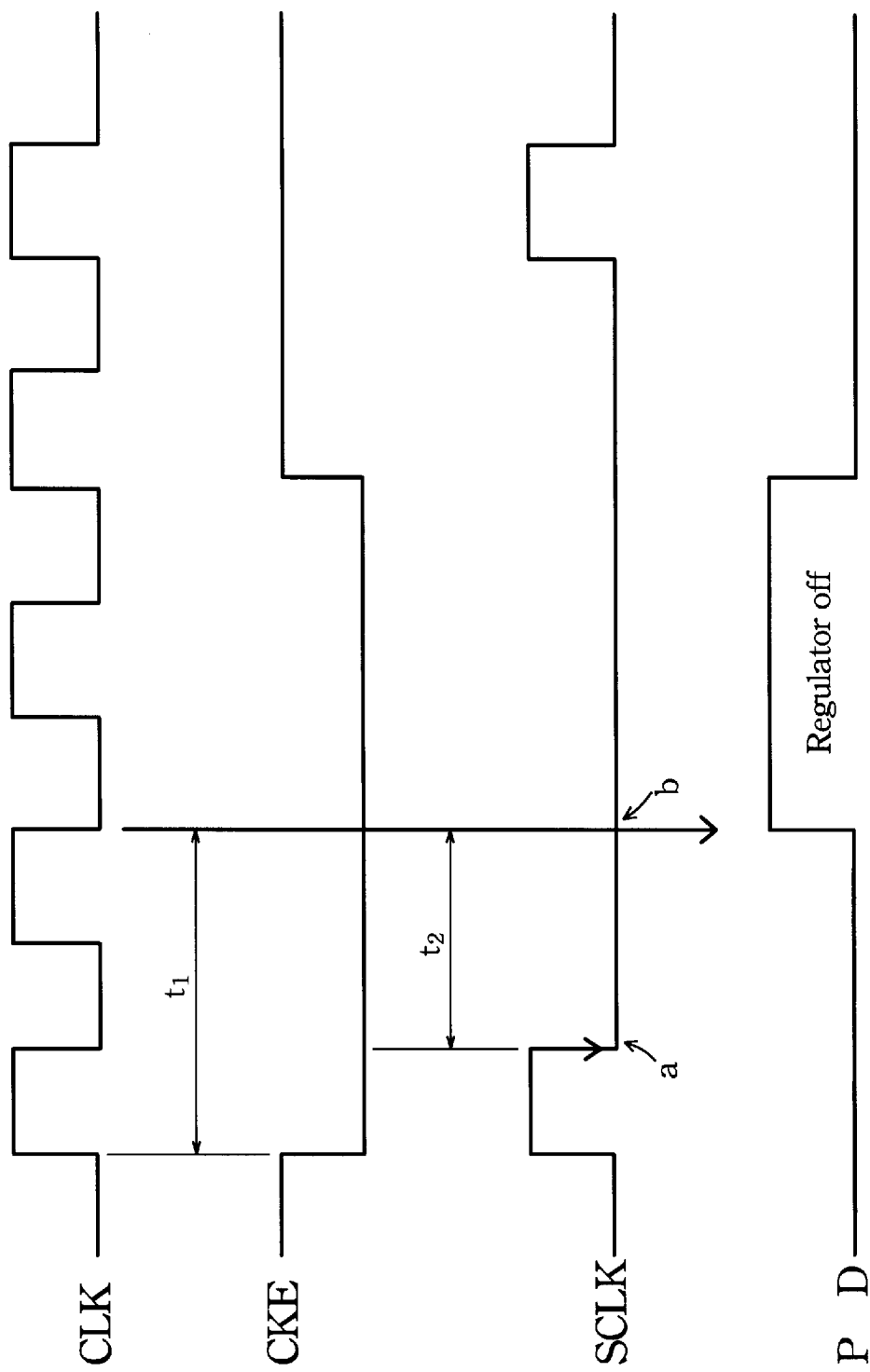
FIG. 1 is a timing chart illustrating an operation in a power down mode.

FIG. 1 shows a timing chart of the present power down scheme. Until a t1 period after the CKE (clock enable signal) turns to the low level, the PD (power down signal) raises to a high level to turn off the regulator for saving the power consumption. The delayed period t1 ensures the PD can only be triggered after an ACT command has been completed, thereby avoiding to affect the read or written information during the procedure of ACT command. In addition, when the memory banks enter the self-refresh mode, the SCLK (self-refresh clock) will toggle at a refresh frequency. If sampling a point where the wave of the SCLK drops dramatically, it would be hard to read out whether the memory banks are at a refresh mode. Since the PD can only be triggered under a non-self-refresh mode, sampling at the point b lagged a period t2 behind the point a could correctly detect the waveform of the SCLK, thereby triggering the PD at a non-self-refresh mode.

Figure 2:
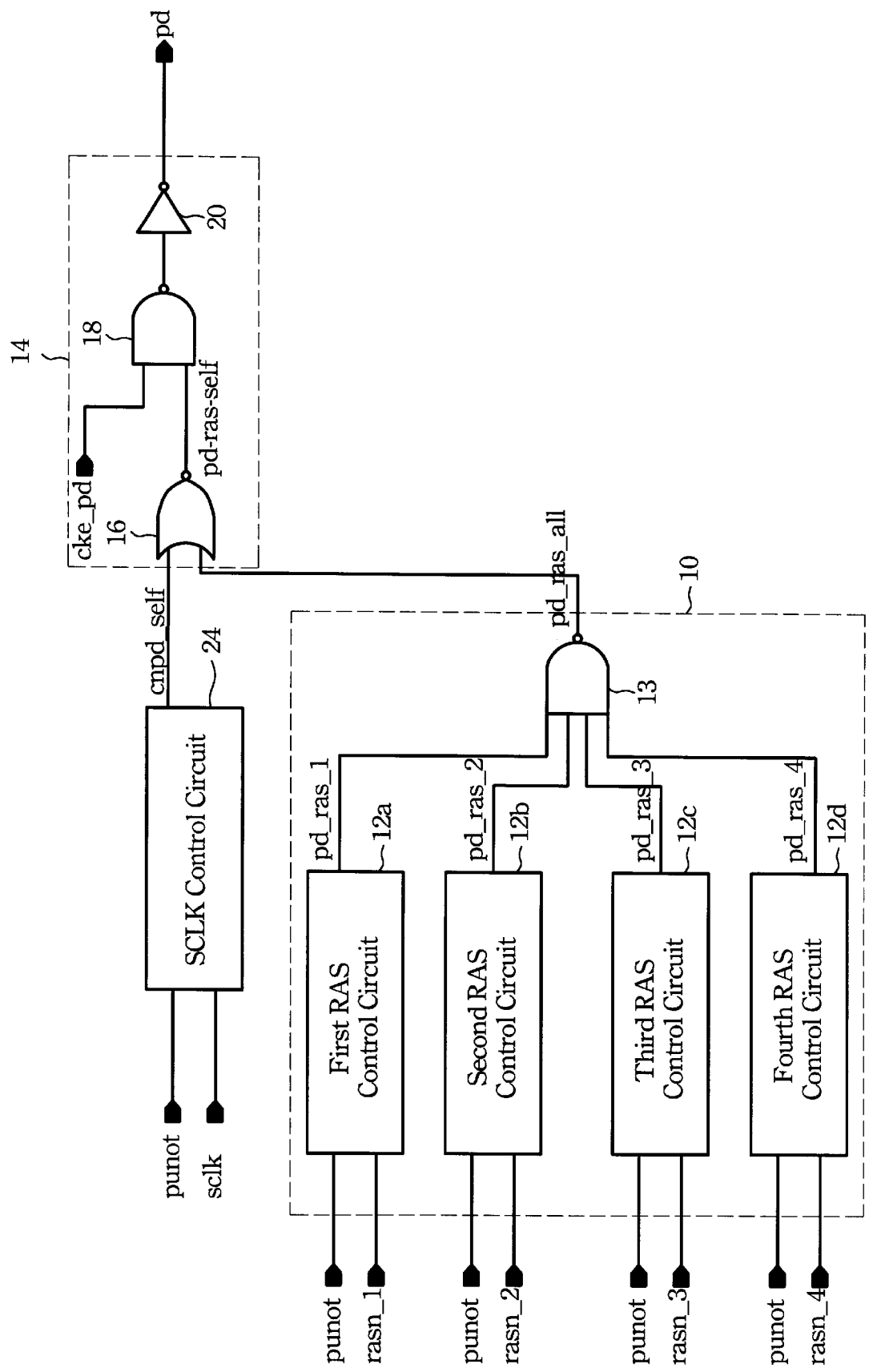
FIG. 2 is a circuit diagram illustrating the present power down system.

FIG. 2 shows a circuit diagram of the power down system according to a preferred embodiment of the present invention. The power down system essentially consists of a RAS control module 10, SCLK control circuit 24, and power down control circuit 14. The RAS control module 10 includes a first RAS control circuit 12a, second RAS control circuit 12b, a third RAS control circuit 12c, and fourth RAS control circuit 12d. These RAS control circuits 12a~12d respond the power reset signals (punot) and ras signals (rasn_1~rasn_4) to generate logic outputs pd_ras_1~pd_ras_4. A NAND gate 13 couples with the RAS control circuits 12a~12d for responding the logic outputs pd_ras_1~pd_ras_4 to generate a first power down control signal pd_ras_all. It is noticed that the number of RAS control circuits 12a~12d is not limited in the number of this preferred embodiment, but is based on that of memory banks.

The SCLK control circuit 24 responds the power reset signal (punot) and the self-fresh clock (sclk) to output a second power down control signal cnpd_self. The power down control circuit 14, which couples with the SCLK control circuit 24 and an input clock enable signal (cke_pd) at a power down state, mainly includes a NOR gate 16, NAND gate 18, and inverter 20. The power down control circuit receives the first power down control signal (pd_ras_all), second power down control signal (cnpd_self), and clock enable signal (cke_pd) to output a power down signal (pd), thereby turning off the regulator to save the power consumption.

Since the SCLK control circuit 24 detects the waveform of the self-refresh clock (SCLK) is at a non-refresh mode and ensure the ACT command denoted by ras signals has been completed, the power down system sends the power down signal (pd) to turn off the regulator without affecting the ACT command as well as avoiding confusing the refresh process.

Figure 3:
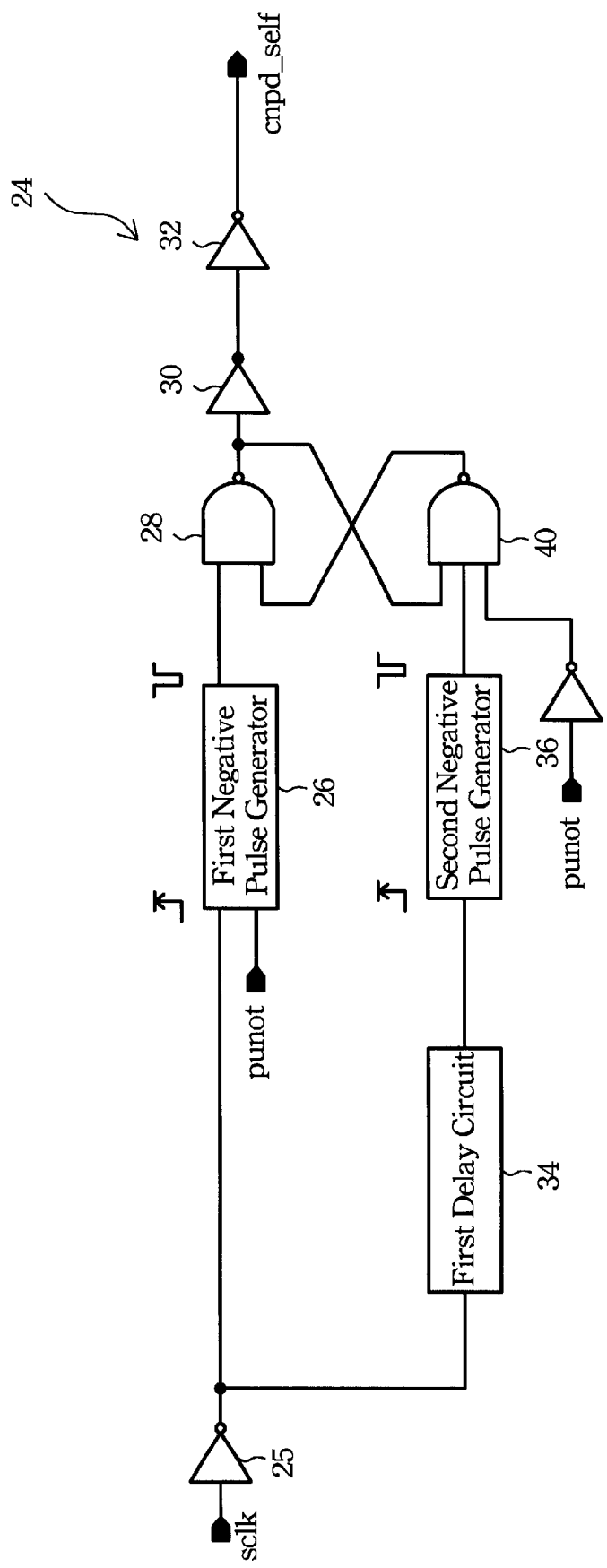
FIG. 3 is a circuit diagram illustrating an SCLK control circuit of the power down system.

FIG. 3 is a detailed circuit diagram of the SCLK control circuit 24 (as shown in FIG. 2). The self-fresh signal (sclk) inputs via an inverter 25 subsequently passing through a first negative pulse generator 26, NAND gate 28, first delay circuit 34, second negative pulse generator 36, and NAND gate 40 to an inverter 30, 32. Finally, the self-refresh clock (sclk) is then output as the second power down control signal (cnpd_self) form the inverter 32.

Figure 4:
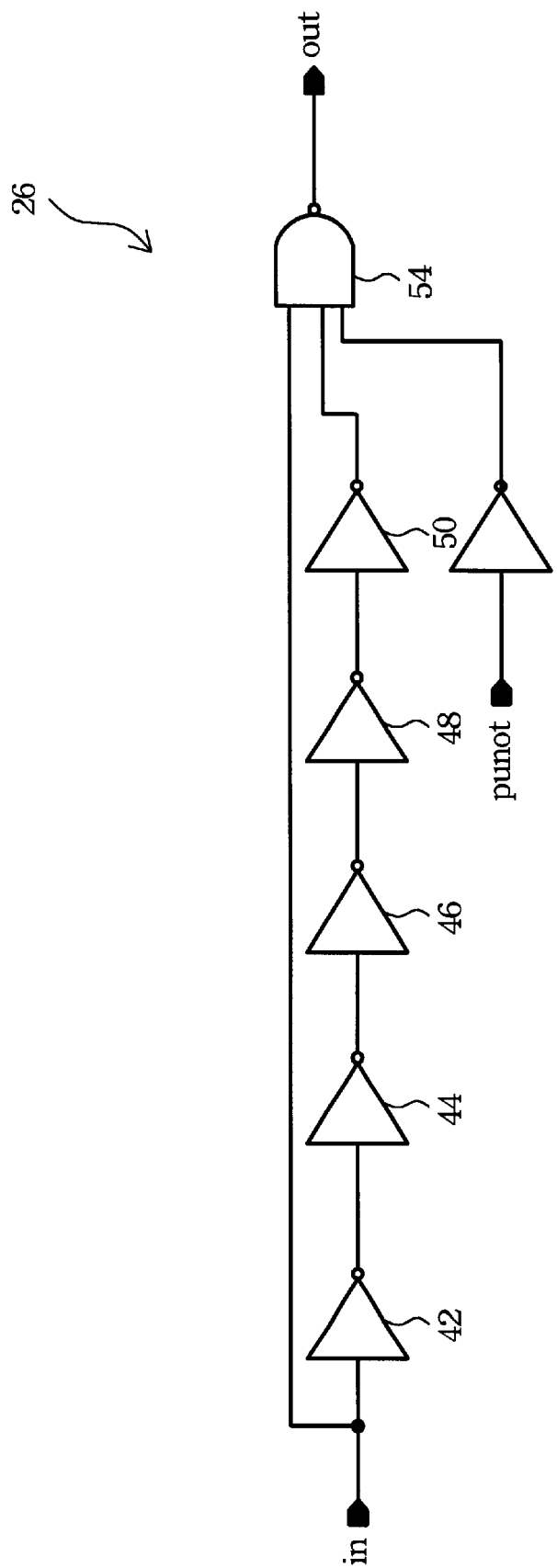
FIG. 4 is a circuit diagram illustrating a first negative pulse generator of the SCLK control circuit.

FIG. 4 illustrates the detailed circuit diagram of the first negative pulse generator 26 (as shown in FIG. 3). An input signal (in) is sent into an inverter 42 subsequently passing through inverters 44, 46, 48, 50 to a NAND gate 54 and then sent out as an output signal (out). By employing this design, the first negative pulse generator 26 is capable of transforming an up-raising input signal into a negative pulse.

Figure 5:
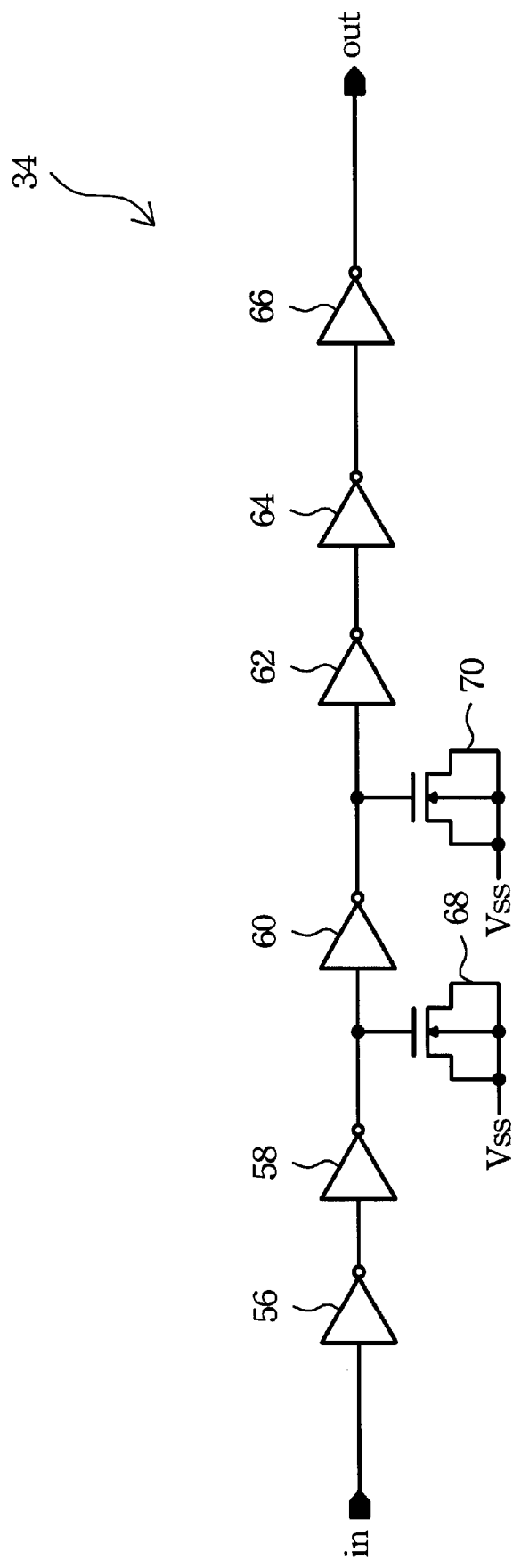
FIG. 5 is a circuit diagram illustrating a first delay circuit of the SCLK control circuit.

FIG. 5 shows a detailed circuit diagram of the first delay circuit 34 (as shown in FIG. 3). An input signal (in) is sent through a group of inverters 56, 58, 60, 62, 64, and 66, which are connected together in series, to generate an output signal (out). MOSFETs 68, 70 couples with inverters in parallel to compensate the decay of input signal passing through the inverters at a desired level. In this embodiment, the first delay circuit 34 may delay the input signal a period about 6.3~12.3 ns.

Figure 6:
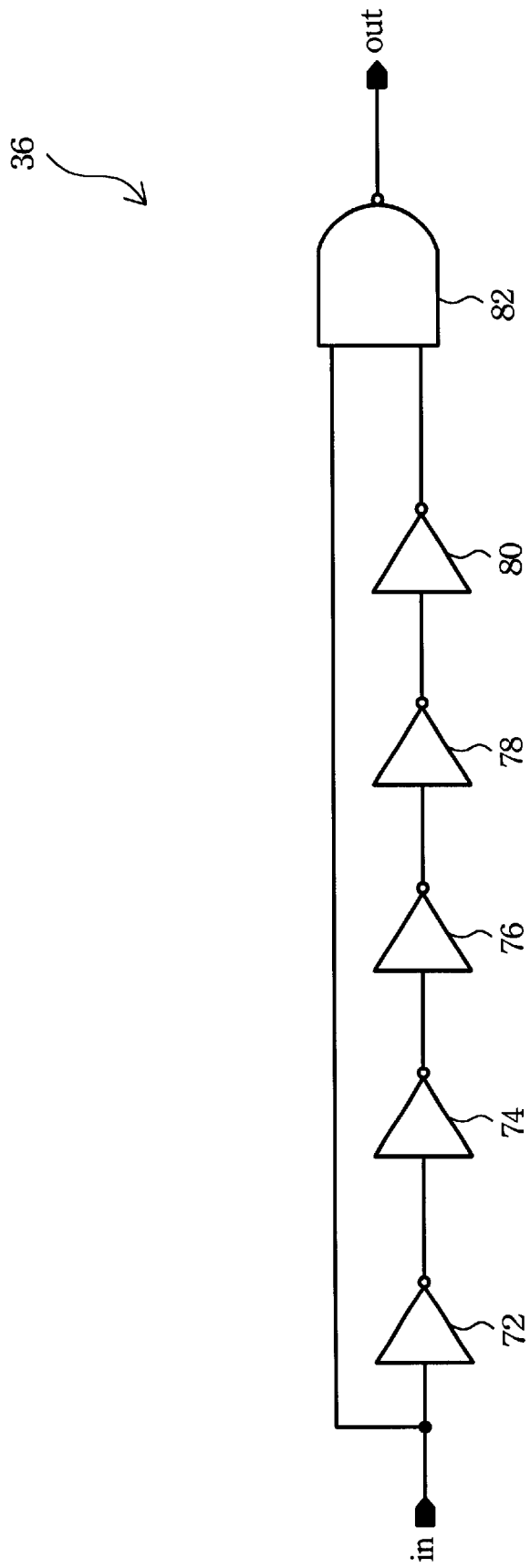
FIG. 6 is a circuit diagram illustrating a second negative pulse generator of the SCLK control circuit.

FIG. 6 illustrates the detailed circuit diagram of the second negative pulse generator 36 (as shown in FIG. 3). An input signal (in) is sent into an inverter 72 subsequently passing through inverters 74, 76, 78, 80 to a NAND gate 82 and then sent out as an output signal (out). Likewise, the second negative pulse generator 36 is capable to transform an up-raising input signal into a negative pulse.

Figure 7:
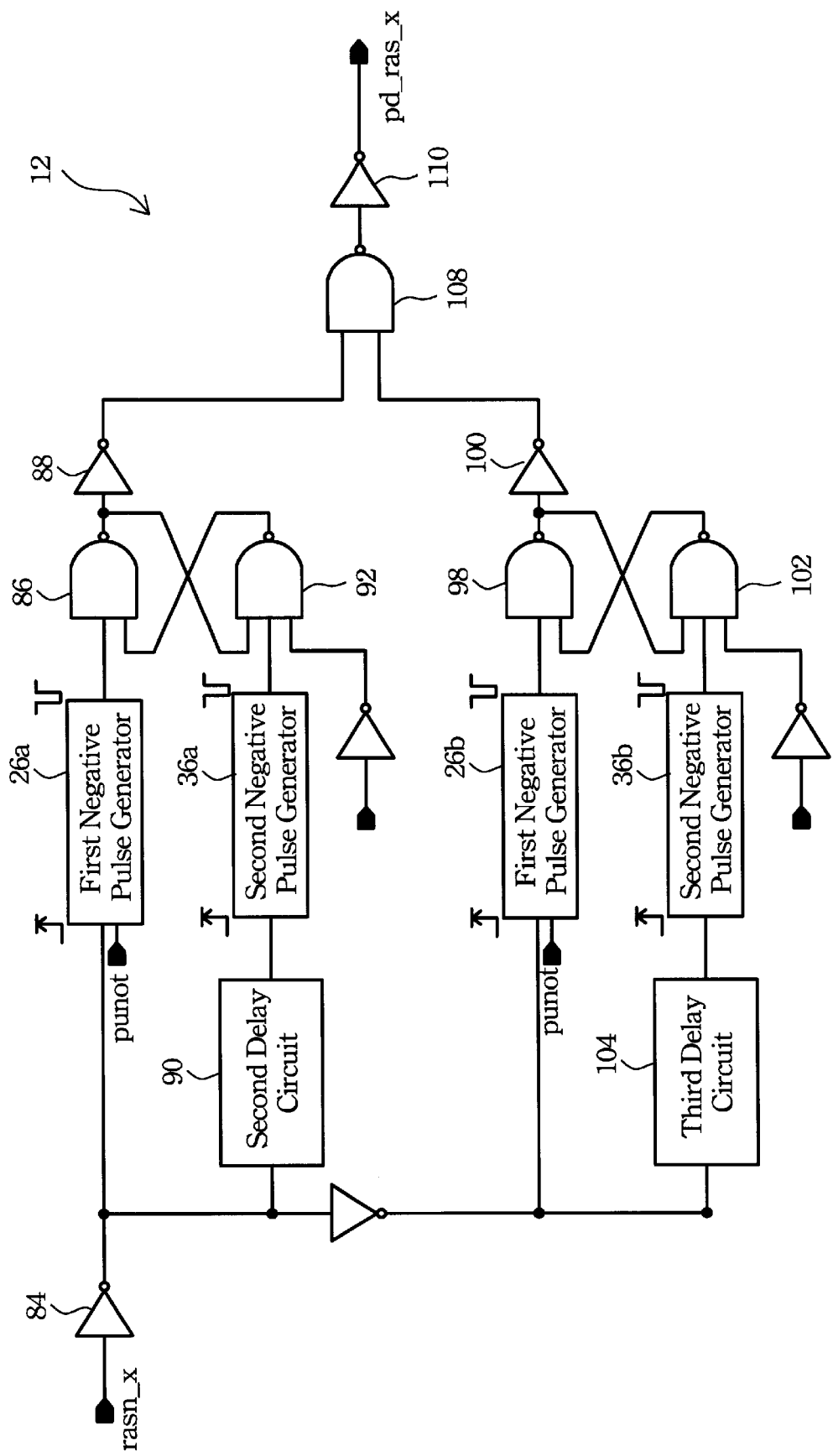
FIG. 7 is a circuit diagram illustrating a RAS control circuit of the power down system.

FIG. 7 is a detailed circuit of the RAS control circuits 12a~12d (as shown in FIG. 2). The row address strobe signal (rasn_x) inputs into an inverter 84, and passing through a first negative pulse generator 26a, NAND gate 86, second delay circuit 90, second negative pulse generator 36a, and NAND gate 92 to an inverter 88. Likewise, the input row address strobe signal (rasn_x) passes through a first negative pulse generator 26b, NAND gate 98, third delay circuit 104, second negative pulse generator 36b, and NAND gate 102 to an inverter 100. A NAND gate 108 coupling with the inverter 88 and 100 receives the outputs form them and generate yet another output through an inverter 110 as a logic output (pd_ras_x) of row address strobe signal (rasn_x).

Figure 8:
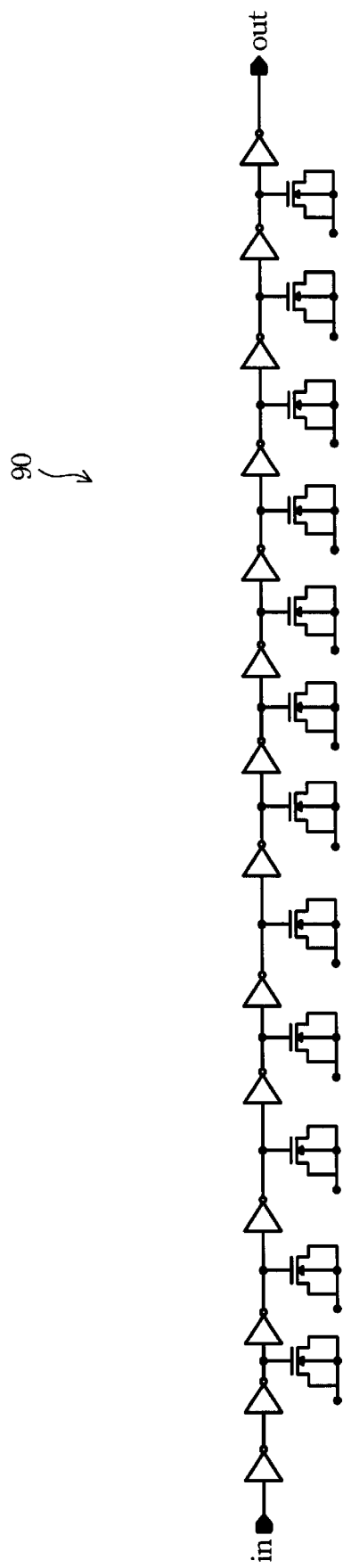
FIG. 8 is a circuit diagram illustrating a second delay circuit of the RAS control circuit.
Figure 9:
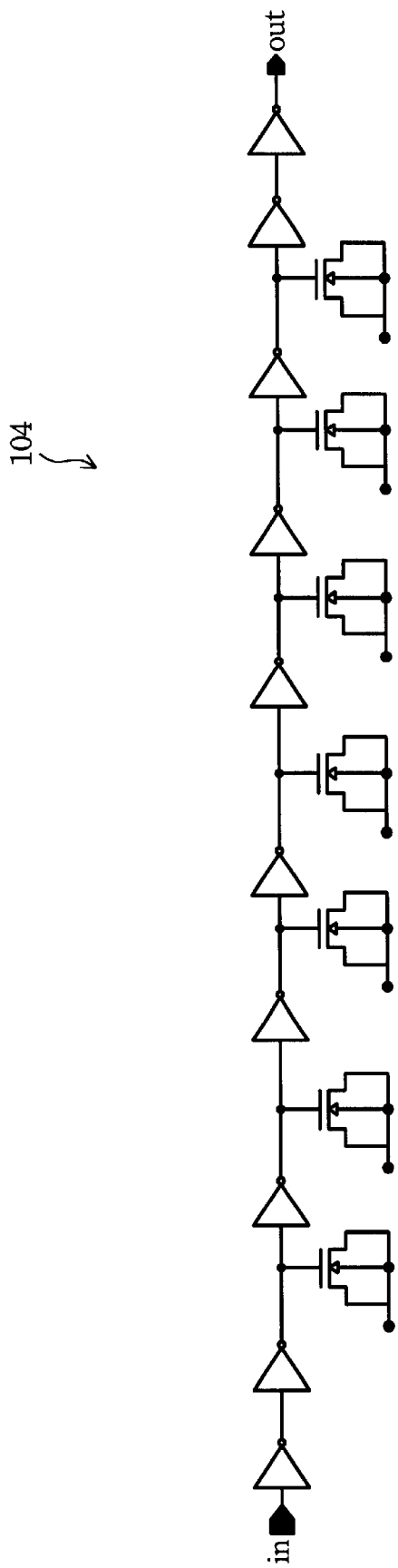
FIG. 9 is a circuit diagram illustrating a third delay circuit of the RAS control circuit.

Finally, FIG. 8 and FIG. 9 illustrate the detailed circuit diagrams of the second delay circuit 90 and third delay circuit 104 (as shown in FIG. 7), respectively. The second delay circuit 90 and third delay circuit 104 includes a plurality of inverters in series connection and a plurality of MOSFETs in parallel connection. Since the construction and function of them are much similar to the first delay circuit (see FIG. 5), there is no further detailed discussion about them.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A power down system for regulated internal power supply in DRAM, the power down system comprising:

ras control module for responding row address strobe signals corresponding to memory banks of the DRAM to output a first power down control signal, while all the row address strobe signals, which denote states of the memory banks, are in a first condition of inactive, the first power down control signal informing the power down system to turn off a regulator in the DRAM under the first condition;

self-refresh clock control circuit for responding to a self-refresh clock to output a second power down control signal, while the self-refresh clock is in a second condition of non-self-refresh mode, the second power down control signal informing the power down system to turn off the regulator under the second condition; and power down control circuit coupling with the ras control module and the self-refresh clock control circuit for responding a clock enable signal, the first power down control signal, and the second power down control signal to output a power down signal to turn off the regulator.

2. The power down system of claim 1, wherein the ras control module comprises a plurality of row address strobe control circuits according to the memory banks, each of the ras control circuit correspondingly receiving the row address strobe signal to generate a logic output.

3. The power down system of claim 2, wherein the row address strobe control module comprises a NAND gate coupling with the row address strobe control circuits, for calculating the logic output to generate the first power down control signal.

4. The power down system of claim 2, wherein the ras control circuit and the self-refresh control circuit comprise a negative pulse generator, a delay circuit, and a logic device.

5. The power down system of claim 4, wherein the negative pulse generator has a function of responding an up-rising signal to generate a negative pulse.

6. The power down system of claim 4, wherein the delay circuit comprises a plurality of inverters in series connection, and a plurality of MOSFETs, which maintain signal transmitting therein in a desired level, in parallel connection.

7. The power down system of claim 1, wherein the power down circuit comprises a NOR gate responsive to the first power down control signal and the second power down control signal to output a third power down control signal.

8. The power down system of claim 7, wherein the power down control circuit comprises a NAND gate coupling with the NOR gate for responding the third power down control signal and the clock enable signal to generate a fourth power down control signal.

9. The power down system of claim 8, wherein the power down control circuit comprises an inverter coupling with the NAND gate for transforming the fourth power down control signal into the power down signal to turn off the regulator.

10. A power down system for regulated internal power supply in DRAM, the power down system comprising:

ras control module having a plurality of row address strobe control circuits for responding row address strobe signals corresponding to memory banks of the DRAM to generate a plurality of logic outputs, a first logic device coupling with the row address strobe circuits receiving the logic outputs to generate a first power down control signal, while all the row address strobe signals, which denote states of the memory banks, are in a first condition of inactive, the first power down control signal informing the power down system to turn off a regulator in the DRAM under the first condition;

self-refresh clock control circuit for responding a self-refresh clock to output a second power down control signal, while the self-refresh clock, which refreshes charges reserved in memory cells of the DRAM, is in a second condition of non-self-refresh mode, the second power down control signal informing the power down system to turn off the regulator under the second condition; and power down control circuit coupling with the row address strobe control circuits and the self-refresh clock control circuit for receiving the first power down control signal and the second power down control signal to generate a third power down control signal representing the power down system being ready to enter a power down mode, a second logic device responding the third power down control signal and a clock enable signal to output a power down signal to turn off the regulator.

11. The power down system of claim 10, wherein the row address strobe control module comprises a NAND gate coupling with the row address strobe control circuits, for calculating the logic outputs to generate the first power down control signal.

12. The power down system of claim 10, wherein the ras control circuit and the self-refresh control circuit comprise a negative pulse generator, a delay circuit, and a logic device.

13. The power down system of claim 10, wherein the power down circuit comprises a NOR gate responsive to the first power down control signal and the second power down control signal to output the third power down control signal.

14. The power down system of claim 13, wherein the power down control circuit comprises a NAND gate and inverter coupling with the NOR gate for responding the third power down control signal and the clock enable signal to generate a fourth power down control signal, the inverter transforming the fourth power down control signal to generate the power down signal.

* * * * *